United States Patent [19]
Brestel

[11] Patent Number: 5,328,811
[45] Date of Patent: Jul. 12, 1994

[54] METHOD OF PRINTING AN IMAGE ON A SUBSTRATE PARTICULARLY USEFUL FOR PRODUCING PRINTED CIRCUIT BOARDS

[75] Inventor: Mordechai Brestel, Rehovot, Israel

[73] Assignee: Orbotech Ltd., Yaune, Israel

[21] Appl. No.: 903,396

[22] Filed: Jun. 24, 1992

[30] Foreign Application Priority Data

Jun. 28, 1991 [IL] Israel .................................. 98660

[51] Int. Cl.$^5$ ............................................. G03C 5/00
[52] U.S. Cl. ................................... 430/325; 430/330;
430/323; 430/318; 430/336; 430/297; 430/299;
430/269; 430/346; 430/4; 430/203; 430/524;
430/495; 430/945; 430/964
[58] Field of Search ................... 430/325, 330, 4, 203,
430/524, 964, 346, 495, 965, 323, 368, 336, 297,
299, 269

[56] References Cited

U.S. PATENT DOCUMENTS

| | | |
|---|---|---|
| 3,773,514 | 11/1973 | Fromson . |
| 3,923,514 | 12/1975 | Marsh . |
| 3,964,907 | 6/1976 | Marsh . |
| 4,013,466 | 3/1977 | Klaiber . |
| 4,259,433 | 3/1981 | Mizobuchi et al. . |
| 4,396,997 | 8/1983 | Kahn et al. . |
| 4,983,252 | 1/1991 | Masui et al. . |
| 4,997,674 | 3/1991 | Parr et al. ............................ 427/423 |
| 5,079,600 | 1/1992 | Schnur et al. . |

FOREIGN PATENT DOCUMENTS 0035239 2/1991 Japan .

Primary Examiner—John Kight, III
Assistant Examiner—Duc Truong
Attorney, Agent, or Firm—Benjamin J. Barish

[57] ABSTRACT

A method of printing an image on a substrate by applying to the substrate a film which is chemically activated by heat, and scanning the film by a beam of radiation according to the image to be printed, to chemically activate the film by heat and thereby to produce a pattern in the film according to the image scanned. The film includes a reagent capable of undergoing a redox reaction when heated in the presence of another reagent present with the film when scanned by the beam, to produce the redox reaction between the two reagents.

28 Claims, 7 Drawing Sheets

METHOD OF PRINTING AN IMAGE ON A SUBSTRATE PARTICULARLY USEFUL FOR PRODUCING PRINTED CIRCUIT BOARDS

FIELD AND BACKGROUND OF THE INVENTION

The present invention relates to a method of printing an image on a substrate. The invention can be used in lithography, information recording, chemical milling and printing, but is particularly useful for producing printed circuit boards, and is therefore described below with respect to this application. It will be appreciated, however, that the invention could advantageously be used in many other applications.

Printed circuit boards (PCBs) are constructed of a substrate of insulating material, such as epoxy glass, having an electrically conductive pattern or net printed on one or both faces. Many techniques have been developed for printing the conductive pattern. The techniques commonly used today start with a substrate having a copper layer on one or both faces. In the production line, the board is coated with a photoresist film, namely a protective film sensitive to light. The photoresist film is exposed to ultraviolet light through a phototool or mask which is photographically constructed according to the desired pattern to be printed, producing a latent image of the pattern in the exposed areas of the photoresist film. The exposed portions of the photoresist film may be rendered less soluble or more soluble. The portions of the photoresist film which are more soluble are removed to bare the copper thereunder. According to some techniques, the so-bared copper is metal-plated; then the remainder (insoluble portion) of the photoresist protective film is removed to bare the copper thereunder, and the so-bared copper portions are completely removed by etching. According to other techniques, the portions of the copper bared by removing the soluble portions of the photoresist are etched, and then the insoluble portions of the photoresist are removed.

The foregoing process for producing printed circuit boards, as well as IC integrated circuit wafers or the like, thus requires the preliminary preparation of the phototools. The preparation of phototools takes considerable lead time, which is not suitable for modern manufacturing demands requiring just-in-time manufacturing techniques. The use of phototools also requires high investment in materials, machines, special environmental storage, and man-power to operate the phototool department. In addition, the large number of steps, and particularly the large number involving human operations, significantly affect the yield.

Because of the foregoing drawbacks in utilizing phototools, efforts are being made for developing new imaging techniques. Particularly promising are direct imaging techniques wherein the pattern is directly imaged on the photoresist by using a beam, such as an X-ray beam, an electron beam, an ion beam, or a laser beam. The beam is operated by using computer-controlled means to provide a sequence of preprogrammed on/off modulating writing signals as the beam is caused to scan the photoresist.

In the basic direct imaging process (as well as in the conventional flood exposure process), ultra- violet or visible radiation is used to expose photographically the photoresist and to activate a photochemical reaction which produces a latent image. The latent image is developed to produce a protective layer pattern. Since the photoresist is sensitive to light (ultraviolet or visible), a safety light must be used from the time the photoresist layer is applied until the protective layer pattern is produced and stabilized.

Another direct-imaging technique is known (e.g. as described in U.S. Pat. No. 4,013,466) in which a visible (blue) flood exposure is used to activate a photochemical reaction in the photoresist, as in the prior art of flood and laser direct-imaging. Here, however, the conventional phototool is replaced by an "eraseable phototool" in the form of a liquid crystal (LC) exposed to an infrared laser to induce a phase transition by the local heating produced by the laser; see for example U.S. Pat. No. 4,013,466. The liquid crystal thus serves as an "eraseable phototool" in place of the regular phototool or photo mask. However, this process also requires the use of a safety light. Moreover, because of the sensitivity of the liquid crystal to ultraviolet light, this process requires the use of a special expensive photoresist, and also only visible light.

Still another direct-imaging technique is described by V. M. Andreev, et al., Autometria, No. 3, 1990, pp. 102–105. In this method, an insulating substrate is coated with a film of a complex salt of copper hypophosphite $[Cu(H_2PO_2)_2]$, or its aminoammonia complexes, and is thermally decomposed when subjected to a laser beam. This results in the formation of fine, dispersed copper particles which exhibit catalytic activity in electroless copper plating processes. This method thus concerns depositing copper particles to be used as a catalytic agent for a subsequent electroless copper plating process, and not the formation of a protective layer for use in subsequent etching or plating processes involved in printed circuit techniques.

BRIEF SUMMARY OF THE INVENTION

The present invention is directed to another direct-imaging technique also based on a thermally-activated chemical reaction, as in the latter publication, but having advantages thereover, as well as in the other known direct-imaging techniques described above.

According to one aspect of the present invention, there is provided a method of printing an image on a substrate by applying to the substrate a film which is chemically activated by heat, and scanning the film by a beam of infrared radiation according to the image to be printed to chemically activate the film by heat and thereby to produce a pattern in the film according to the image scanned; characterized in utilizing, in the film, a first reagent having a high absorbence of infrared radiation and capable of undergoing a redox reaction when heated in the presence of a second reagent; and scanning the film by the beam while the second reagent is present with the film, to produce the redox reaction between the two reagents.

According to a further feature in preferred embodiments of the invention described below, the first and second reagents are selected to be capable of undergoing an exothermic redox reaction when heated in the presence of each other.

According to further features in the preferred embodiments of the invention described below, the second reagent may be a second film, or it may be in a fluid atmosphere around the film, or it may be included in the film. In addition, the film including the first reagent has a high absorbence of infrared radiation.

According to still further features in the described preferred embodiments, the film is a protective film of an etch-resist material. The substrate may be subsequently subjected to an etchant capable of etching the portions of the substrate underlying the pattern but not underlying the protective film, or the substrate may be subsequently subjected to a metal plating step capable of plating the portions of the substrate underlying the pattern but not underlying the protective film.

It will thus be seen that while the method in the Autometria publication involves the thermal decomposition of a complex metal, the invention in the present application, according to one aspect, involves a thermally-induced redox reaction between two reagents, namely between the material of the film and the second reagent which is present when the film is scanned by the beam of radiation. By the appropriate selection of the materials of the film and of the second reagent, the amount of heat energy required in order to produce the pattern on the film may be substantially reduced. Moreover, while the method in the Autometria publication involves the production of a pattern by depositing a catalytic agent which can be used in an electroless-plating process, the present invention involves, according to another aspect, the production of a pattern by substantially displacing the material of the protective film where impinged by the beam of radiation, which pattern is used for further processing of the substrate.

According to still further features in the described preferred embodiments, the first reagent is a metal compound capable of being reduced by the reducing agent in the heat-induced redox reaction to produce the pure metal. Particularly good results have been obtained when the film is copper (cupric) oxide (CuO). Copper sulphide may also be used. Both films are reduced to pure copper. Such films are substantially "black" and have a high absorbence of infrared radiation, thereby enhancing the localized heating according to the image scanned by the infrared radiation beam.

According to still further features in the described preferred embodiments, the substrate includes an insulating base having a metal layer. The metal of said metal compound may not be the same as that of the metal layer on the insulating base. In such a case, the metal deposition may also be used as a protective layer or as a catalytic agent to produce a protective layer which will serve as the conducting net in the end of the process.

According to further features in the described preferred embodiments, the reducing agent is an organic compound. Theoretically, almost any organic compound may be used as the reducing agent, including aldehydes, alcohols, amines, alkenes, alkanes, sugars, derivatives of the above and polymeric forms of the above. Embodiments are described wherein the organic reducing agent is in the form of a polymeric coating, such as a polyacrolein overlying the copper oxide or sulphide film. Alternatively, the protective layer may be copper oxide swelled by the reducer, for example formaldehyde.

According to still further features in the preferred embodiments of the invention described below, the laser beam is constituted of high-peak power pulses of short duration, and includes a laser pulse for each pixel of the image to be printed. Particularly advantageous results are produced wherein the substrate includes a layer of copper, the film is of copper oxide, and the laser beam is an Nd:YAG laser beam of 1.06 $\mu$m, which is absorbed selectively by the copper oxide film, whereas the copper layer reflects most of the energy, resulting in a high degree of selective heating only in the copper oxide layer.

Further features and advantages of the invention will be apparent from the description below.

BRIEF DESCRIPTION OF THE DRAWINGS

The invention is herein described, by way of example only, with reference to the accompanying drawings, wherein FIGS. 1-7 diagrammatically illustrate a number of examples of a method of printing an image on a substrate in accordance with the present invention.

DESCRIPTION OF PREFERRED EMBODIMENTS

Figure 1:
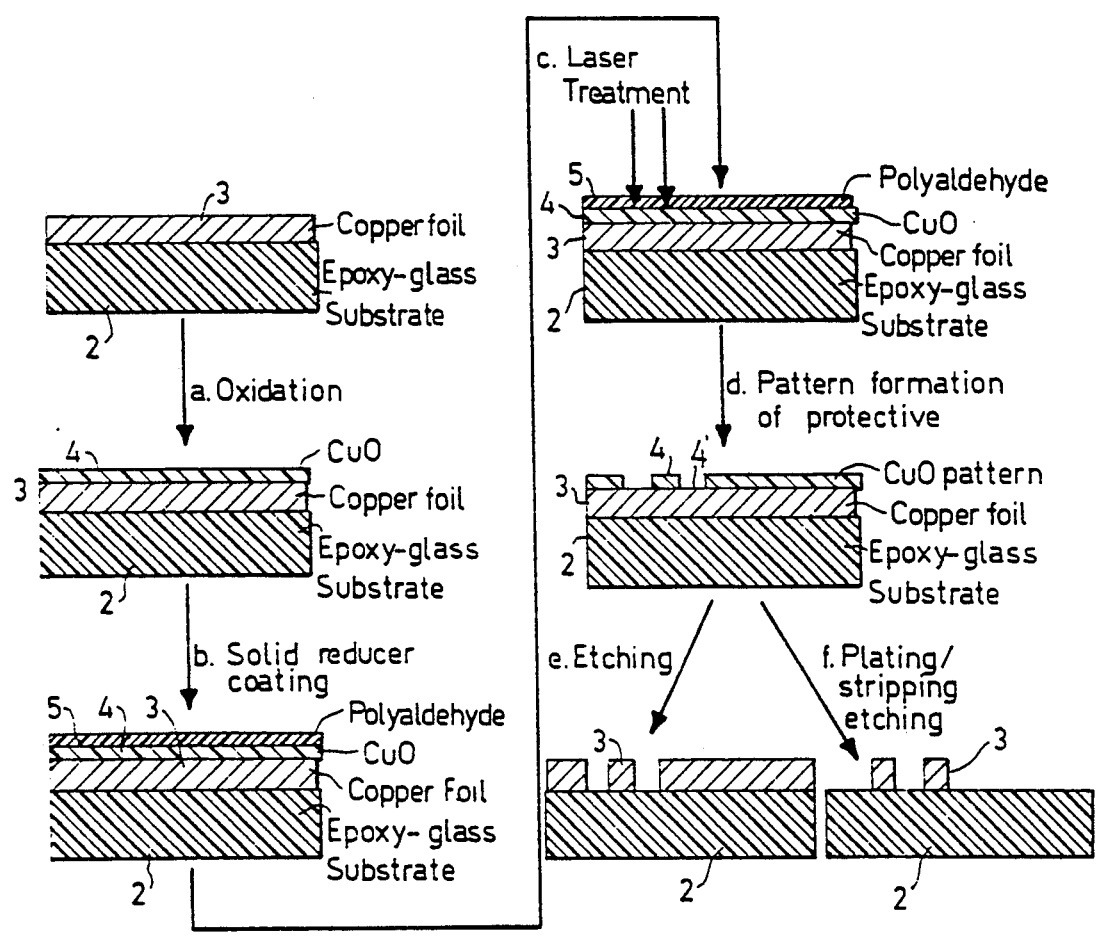

All the methods illustrated in the drawings are described below particularly for producing printed circuit boards, since this is an especially useful application of the invention; but it will be appreciated that the method could also be used in many other applications, for example in producing IC (integrated circuit) wafers, ornamentation, and the like.

The method illustrated in FIG. 1 is performed on a substrate including an insulating base of epoxy-glass 2 having a layer 3 of copper foil, such as commonly used for producing printed circuit boards.

The substrate is first subjected to an oxidation process (step a) in which a "black" film of copper oxide (CuO) 4 is produced on the face of the copper foil 3. A coating of a reducing agent 5 is then applied to the outer face of the copper oxide film (step b). The reducing agent 5 should be of a material capable of undergoing a redox reaction with the copper oxide film 4 when heated.

The article is then subjected to a laser treatment (step c), in which a laser beam of infrared radiation scans the above-mentioned coating of the copper-oxide film 4 according to the image to be printed on the substrate. To achieve efficient local heating and induce chemical reaction, the Nd:YAG laser reaidating in 1.06 $\mu$m gives best results. The localized heating along the scanned lines produces an exothermic redox reaction between the copper oxide film 4 and the reducing agent layer 5 such as to reduce the copper oxide film 4 and to displace it along the scanned lines. It will thus be seen that the bared copper shown at 4' surrounded by the remaining oxide film will define a pattern, negative or positive, corresponding to the image to be printed on the substrate.

From this point, the process may proceed according to any of the known techniques conventionally used in printed circuit boards for removing the portions of the copper foil 3 either underlying the copper oxide film 4, or the bare copper pattern 4' produced as a result of the heat-induced redox reaction. Thus, as shown by step e, the article is subjected to an etching operation for removing the bare copper part of the copper foil layer 3, and then removing the copper oxide film 4, whereby the remaining portions of the original copper foil layer 3 represent a negative image of the pattern scanned by the laser beam. Alternatively, the article resulting from step d may be subjected to the operations indicated in step f, wherein a metal plating is applied over the bare copper pattern 4', the copper oxide film is removed, and the underlying portions of the copper foil layer 3 are then etched away, whereby the remaining portions of the copper foil layer 3 represent a positive image of the pattern scanned by the laser beam.

Many processes are known for oxidizing the copper foil layer 3 in the oxidation step a to produce the copper oxide film 4. As one example, the copper foil layer 3 may be reacted with a base solution of NaClO$_2$, producing CuO. This produces a "black" copper oxide layer in which the copper (cupric) oxide is in the form of needle-like fingers perpendicular to the surface of the copper foil layer 3. Such a blackened copper oxide layer exhibits high absorption of infrared radiation. Instead of producing a copper oxide film 4, there may also be produced a copper sulphide film, e.g., by reacting the metal copper layer 3 with hot concentrated sulphuric acid. The treatment is carried out to produce a film 4 of a "black" oxide or "black" sulphide, having a thickness of a fraction of a micrometer up to few micrometers ($\mu$m). In a typical commercial printed circuit board, the thickness of the complete copper foil layer 3 is about 10 $\mu$m up to some tens of micrometers.

The reducing agent coating 5 applied in step b is preferably a polyaldehyde, such as a polymer of polyacrolein. Another solid reducing agent which may be used for layer 5 is paraformaldehyde.

The laser treatment step c produces local heating along the lines scanned by the laser beam, causing the copper oxide (or sulphide) film 4 to react with the reducing agent coating 5 along the lines scanned by the laser beam and to decompose to bare the copper along those scanned lines, according to the following exothermic reaction:

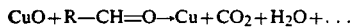

$$CuO + R\text{—}CH{=}O \rightarrow Cu + CO_2 + H_2O + \ldots$$

The amount of copper that is produced by decomposition according to the above redox reaction is very small and therefore the laser treatment (step c) appears to "displace" or "burn away" the copper oxide film along the scanned lines; actually, however, all the products of the reaction are by-products.

The copper oxide 5 may be stripped from the copper layer 3 (in step e or step f) by using a suitable dilute acid, for example dilute hydrochloric acid, which does not react with the copper but does remove the copper oxide. The remaining operations involved either in step e or in step f are well known in printed circuit technology, and therefore further details are not set forth herein.

It will thus be seen that in the process illustrated in FIG. 1, the copper oxide (or sulphide) layer 4 serves three functions: (1) as an absorber of the laser radiation during the laser treatment (step c); (2) as an oxidizer in the redox reaction produced by the laser treatment and resulting in the copper oxide displacement; and (3) as the etching/plating resist pattern used as a protective layer for the subsequent processing, as indicated by steps e or f, for producing the printed circuit board.

Figure 2:
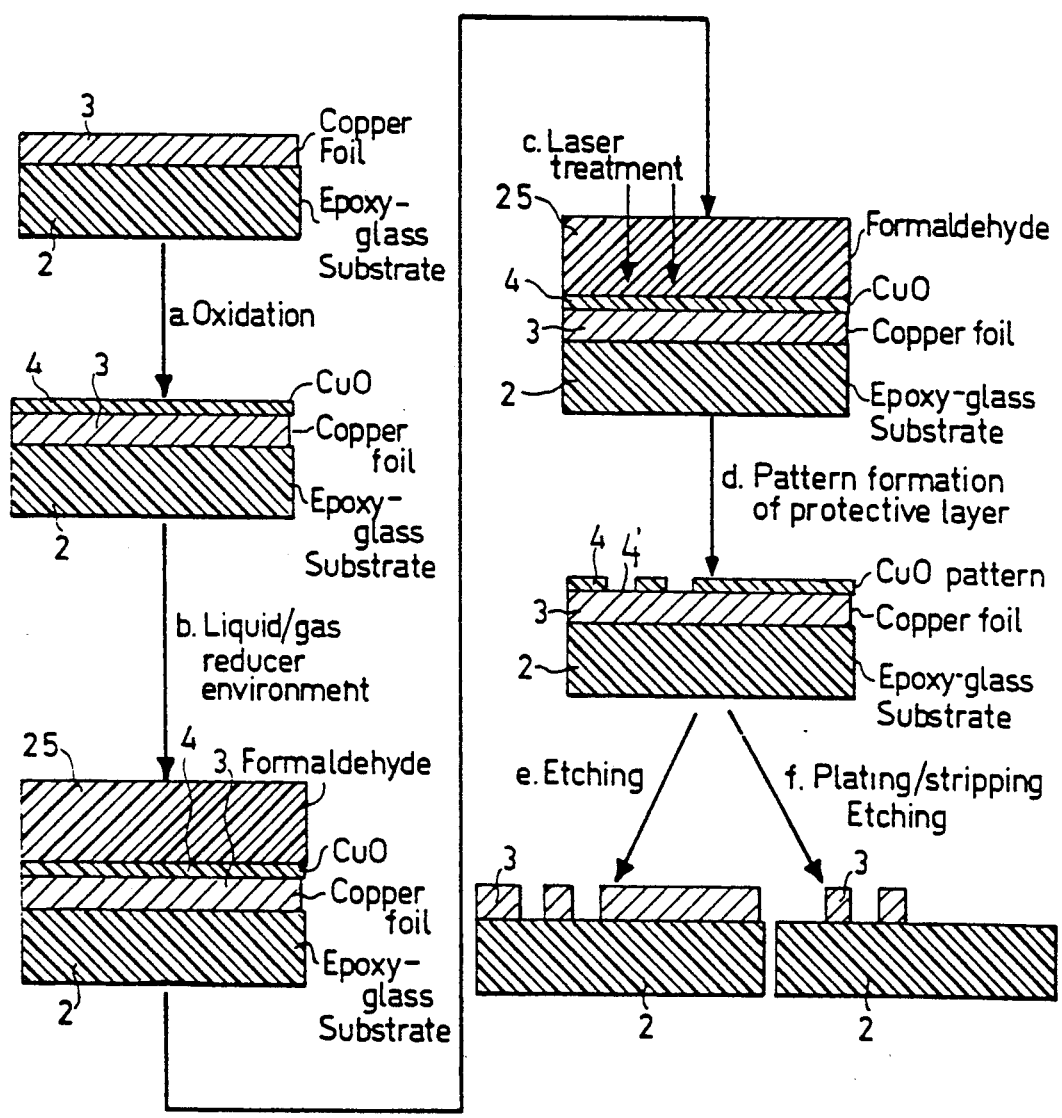

FIG. 2 illustrates a process similar to that of FIG. 1, and therefore the steps a-f, and the various elements of the produced article, are similarly labelled as in FIG. 1 to facilitate understanding. In the process illustrated in FIG. 2, however, the reducing agent (applied in step b) is a fluid medium, more particularly formaldehyde, which immerses the copper oxide film 4 at the time it is subjected to the laser treatment (step c), to reduce the copper oxide to pure copper along the scanned lines by the heat-induced redox reaction resulting from the absorption of the laser energy. The formaldehyde gaseous atmosphere is diagrammatically shown at 25 in steps b and c of FIG. 2. Since this atmosphere is in a gaseous state, it does not remain as a layer on the substrate, and therefore it is not shown following the laser treatment (step c). Thus, the method illustrated in FIG. 2 is similar to that of FIG. 1, in that copper oxide is also served as an infrared radiation absorber, as an oxidizer in the redox reaction resulting in copper oxide displacement, and as a protective layer in the etching/plating processes.

Figure 3:
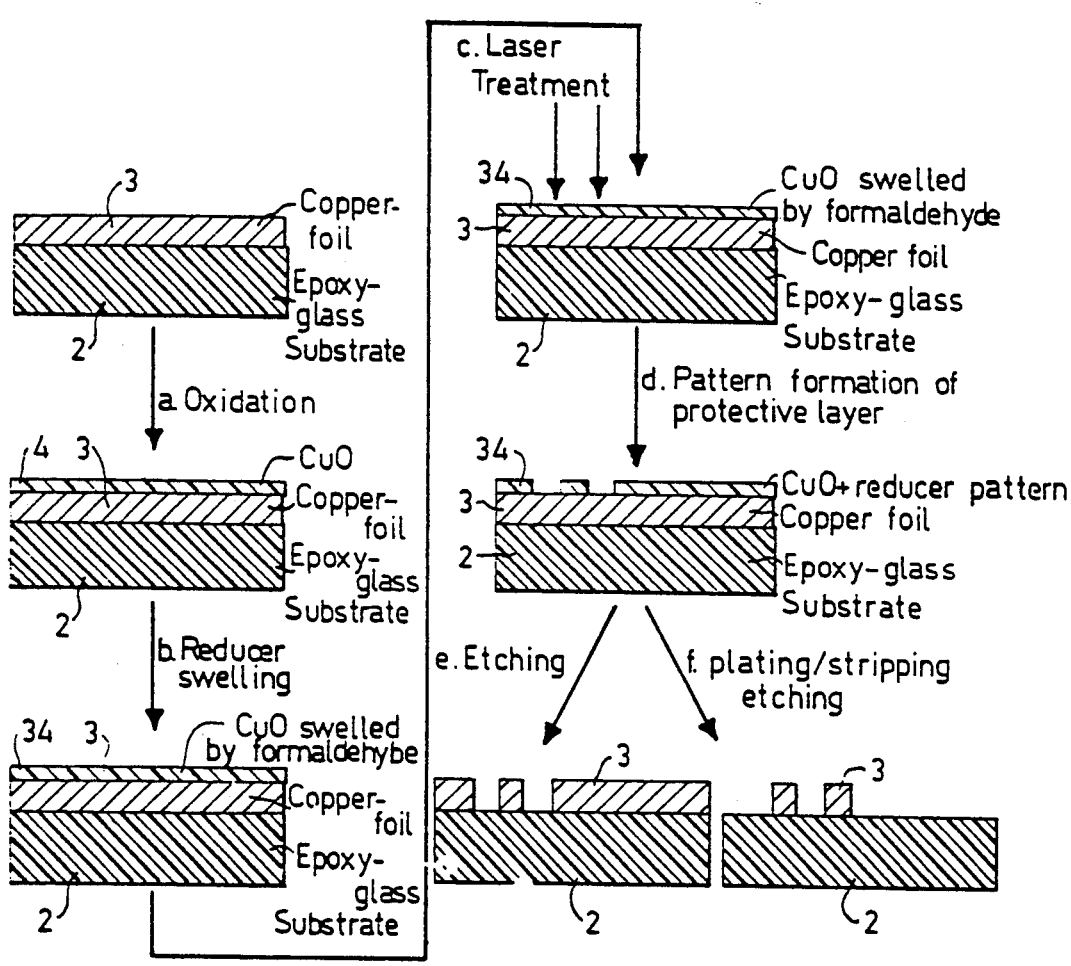

FIG. 3 diagrammatically illustrates a process similar to that of FIG. 2, except that the reducing agent used in step b is mixed with an oxidizing agent rather than a separate film or phase. Thus, the reducing agent in the process of FIG. 3 is also formaldehyde, but in the form of a liquid solution which immerses the copper oxide layer 4 and causes it to swell. The swelled copper oxide layer is diagrammatically indicated at 34 in FIG. 3, following the application of the reducer (step b). The copper oxide layer 34 swelled by the formaldehyde is subjected to the same laser treatment (step c), and is reduced to bare copper by the local heat received from the laser in the same manner as described above with respect to FIGS. 1 and 2. The remainder of the process illustrated in FIG. 3 is also completed in the same manner as described above with respect to FIG. 1.

It will thus be seen that in the method illustrated in FIG. 3, the reducing agent is incorporated in the film containing the oxidizing agent (i.e., the copper oxide film swelled with the formaldehyde). The copper oxide in this film serves both as an infrared radiation absorber and as an oxidizer in the redox reaction. The laser treatment results in the displacement of this film where impinged by the laser beam, thereby resulting in the formation of a protective layer which may serve as an etching/plating resist.

Figure 4:
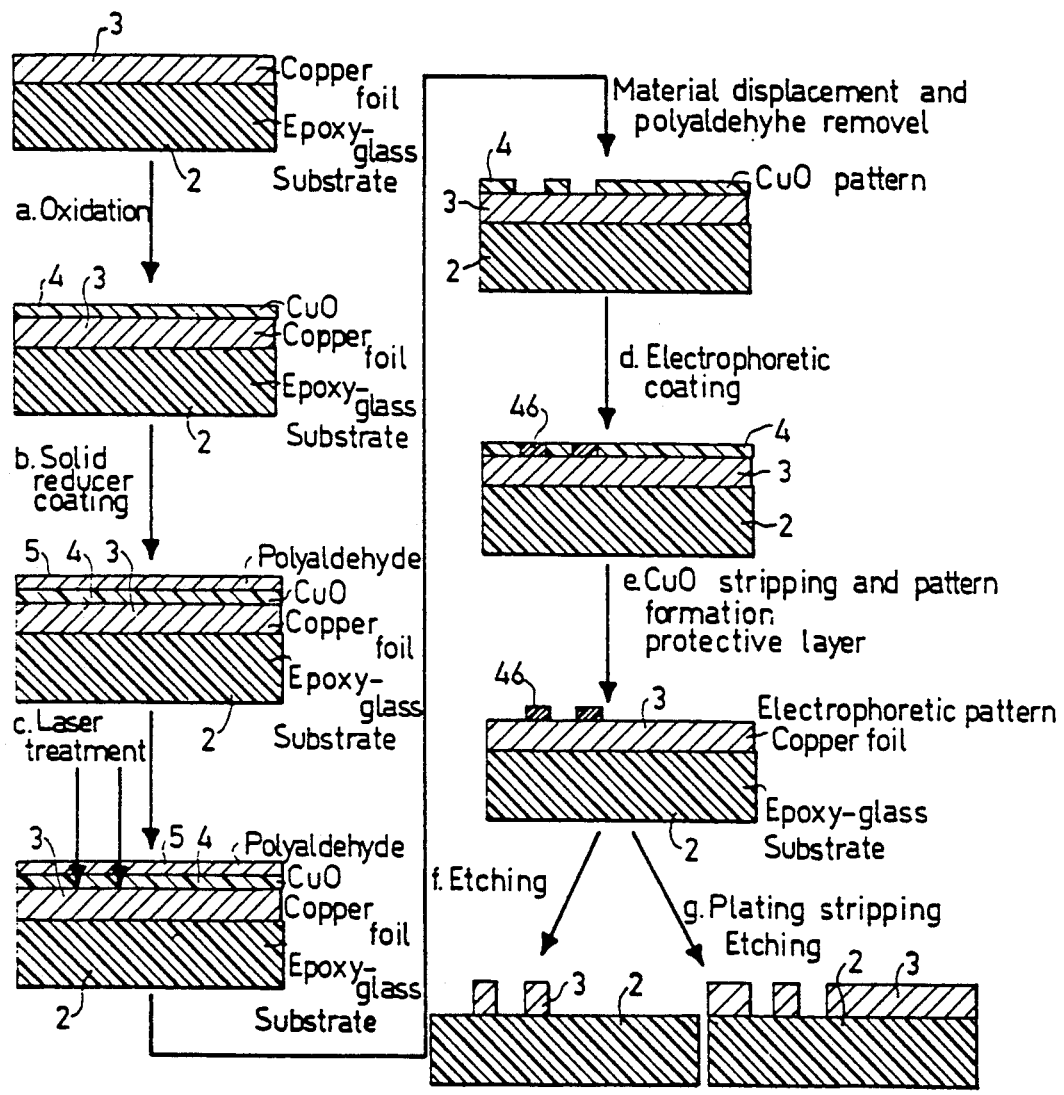

FIG. 4 diagrammatically illustrates a process similar to that of FIG. 1 and therefore carrying the same reference numerals. Thus, the process of FIG. 4 also applies a polyaldehyde film 5 as the reducing agent (step b) for reducing the copper oxide by the laser treatment (step c). In the process of FIG. 4, however, following the laser treatment (step c), the article is subjected to an electrophoretic coating treatment, step d in FIG. 4, wherein a resist is electrophoretically deposited over the bare copper pattern 4' (step c). This electrophoretic coating is illustrated at 46 in FIG. 4, following step d.

After coating 46 is electrophoretically deposited over the bare copper pattern 4' the copper oxide layer 4 is then stripped, e.g., in the same manner as described above with respect to FIG. 1, as shown in step e, so that the electrophoretic coating now serves as the resist pattern for the subsequent etching operations. The further processing may be according to any of the known printed circuit techniques as briefly described with respect to FIG. 1, e.g., by etching alone, as indicated by step f, or by plating/stripping and etching, as indicated by step g.

It will thus be seen in the process illustrated in FIG. 4, the copper oxide layer 4 is used as an absorber of the laser radiation during the laser treatment step (c), and also as an oxidizer in the redox reaction produced by the laser treatment and resulting in the copper oxide displacement. In this process, the copper oxide pattern serves as a resist for an electrophoretic coating applied in step d over the bare copper resulting from the redox reaction, the electrophoretic coating is used as the resist pattern for the subsequent etching and/or plating operations as indicated by steps f and g in FIG. 4.

The electrophoretic coating 46 applied in step d of FIG. 4 may be one of the known resist coatings electrophoretically applied in conventional (photochemical) techniques; similarly the subsequent etching or plating/stripping/etching operations schematically indicated by steps f and g in FIG. 4, may also be those of conventional techniques using photosensitive resists.

Figure 5:
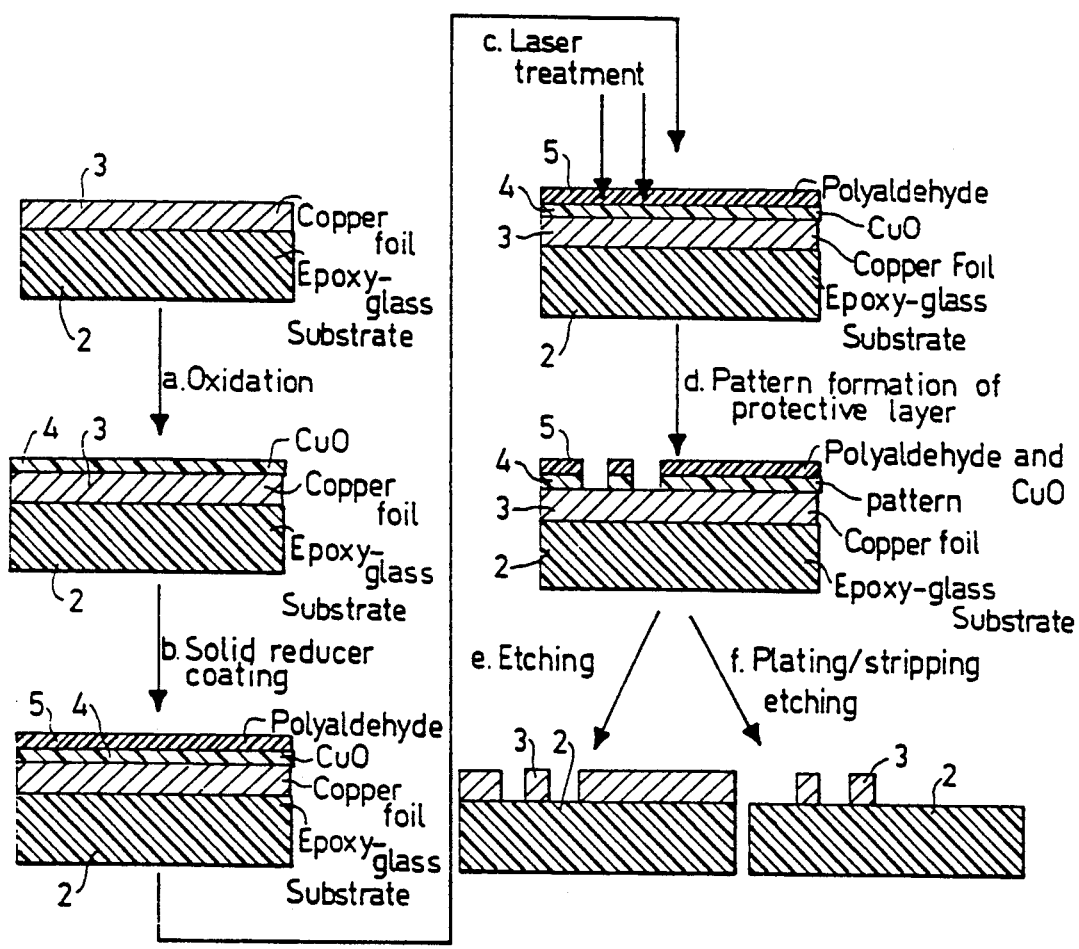

FIG. 5 illustrates a process also similar to that of FIG. 1, and therefore its elements and steps are identified by the same reference characters. Thus, it also includes a polyaldehyde polymer used as the reducer film 5, except that in FIG. 5, the polyaldehyde film 5 is not stripped away after the laser treatment (step c); rather it is retained and serves as the resist pattern for the subsequent etching operations.

Thus, in the process illustrated in FIG. 5, the copper oxide layer 4 is used both as the absorber for the laser radiation, and also as one of the reagents in the redox reaction to produce the pattern of a film, comprising the copper oxide layer and the polyaldehyde (e.g. polyacrolein) layer, corresponding to FIG. 1, along the scan lines of the radiation beam. However, whereas in the process of FIG. 1 the copper oxide pattern (4') is used as the etchant/plating resist pattern, in the process of FIG. 5 the polyaldehyde coating 5 is used as the etchant resist pattern.

Figure 6:
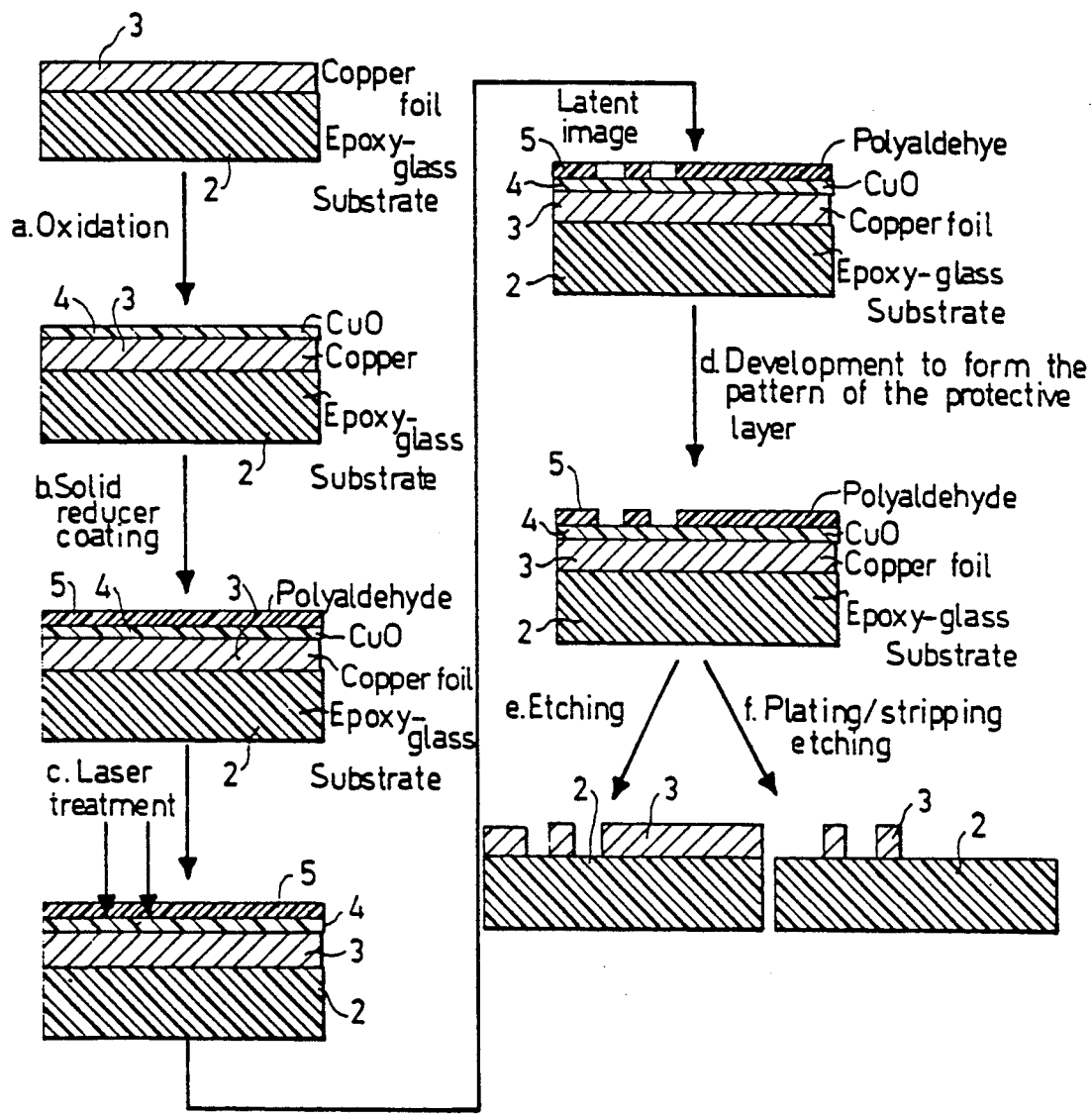

FIG. 6 illustrates a process similar to that of FIG. 5 (and is therefore correspondingly numbered), except that the laser treatment (step c) does not "displace" the copper oxide film, but rather produces a "latent image" in the overlying organic reducer layer. That is, the products produced as a result of the laser treatment are not displaced so as to create an appearance of the reduced film being removed or replaced where impinged by the laser beam; rather the products so produced are more soluble than the organic reducer layer not impinged by the laser beam, so that the laser-impinged portions of the film may be removed by rinsing in an organic solvent.

Figure 7:
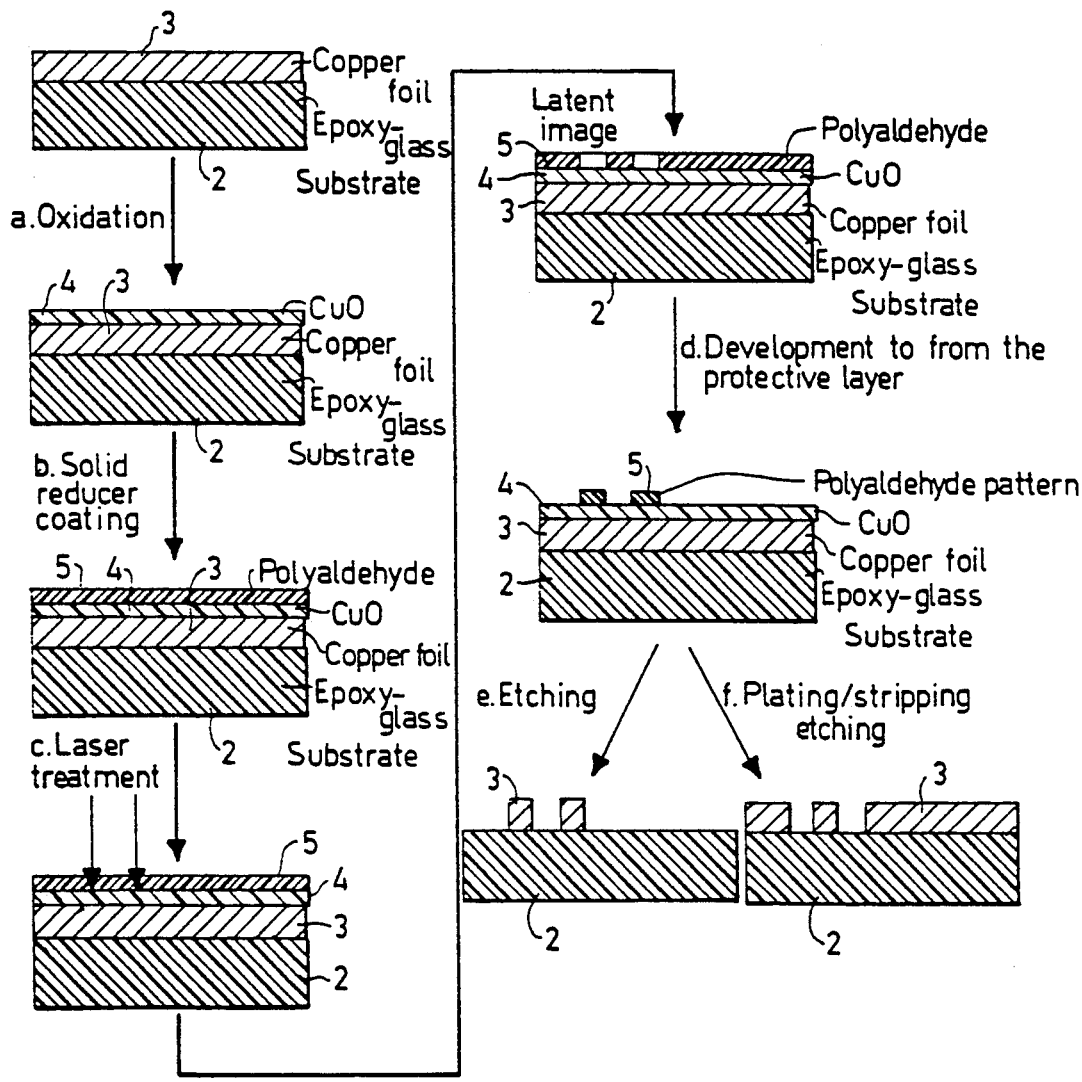

FIG. 7 illustrates a process similar to that of FIG. 6, except that, in this case, the reducer coating 5 is selected so that when it and the copper oxide are exposed to the laser beam, a "latent" image is produced in which the organic reducer is converted to a less soluble compound than the untreated portions with respect to certain solvents, so that the organic reducer film not exposed to the laser beam may be selectively removed by dissolution.

In the methods illustrated in FIGS. 6 and 7, copper oxide is again used as an infrared radiation absorber and as an oxidizer in the redox reaction, but the protective layer is formed of the polyaldehyde which serves as an etching/plating resist.

While the invention has been described with respect to a number of preferred embodiments, it will be appreciated that these are set forth merely for purposes of example, and that many other variations, modifications and applications of the invention may be made.

What is claimed is:

1. A method of printing an image on a substrate by applying to the substrate a film which is chemically activated by heat, and scanning the film by a beam of infrared radiation according to the image to be printed to chemically activate the film by heat and thereby to produce a pattern in the film according to the image scanned; characterized in: utilizing, in said film, a first reagent having a high absorbence of infrared radiation and capable of undergoing redox reaction when heated in the presence of a second reagent; and scanning said film by said beam while said second reagent is present with the film, to produce said redox reaction between said two reagents.

2. The method according to claim 1, wherein said second reagent is in a second film.

3. The method according to claim 1, wherein said second reagent is in a fluid atmosphere around said film.

4. The method according to claim 1, wherein said second reagent is included in said film.

5. The method according to claim 1, wherein said film is a protective film of an etch-resist material.

6. The method according to claim 1, wherein said film is a protective film of a metal-plating resist material.

7. The method according to claim 2, wherein said first reagent is a metal compound capable of being reduced by said reducing agent in said heat-induced redox reaction to produce the bare metal.

8. The method according to claim 7, wherein said metal compound is copper oxide which decomposes to bare copper by said redox reaction.

9. The method according to claim 7, wherein said metal compound is copper sulphide which decomposes to produce bare copper by said redox reaction.

10. The method according to claim 7, wherein said substrate includes an insulating base having a metal layer carrying said film including said metal compound.

11. The method according to claim 10, wherein the metal of the metal compound in said film is the same as that of the metal layer on the insulating base.

12. The method according to claim 11, wherein said metal of the metal compound and of the metal layer on the insulating base is copper.

13. A method of printing a desired image on a substrate including an insulating base and a copper layer thereover, comprising: forming a film of a copper compound having high absorbence of infrared radiation on said copper layer and capable of being reduced by a reducing agent in a heat-induced redox reaction to decompose to pure copper; while the film is exposed to the reducing agent, scanning said film by a beam of infrared radiation according to the image desired to be printed to induce a redox reaction thereby to produce a pattern of pure copper on first portions of the copper layer, while second portions of the copper layer are covered by said film; and removing one of said portions of the copper layer to produce said desired image.

14. The method according to claim 13, wherein said film is a protective film of an etch-resist material, said substrate being subsequently subjected to an etchant capable of etching the portions of the substrate underlying said pattern when not underlying said protective film.

15. The method according to claim 13, wherein said film is a protective film of a metal-plating resist material, said substrate being subsequently subjected to a metal plating step capable of plating the portions of the substrate underlying said pattern but not underlying said protective film.

16. The method according to claim 13, including the further steps, following the plating step, of removing the protective film and then etching the portions of the substrate underlying the protective film but not underlying said pattern.

17. The method according to claim 13, wherein said reducing agent is an organic compound.

18. The method according to claim 17, wherein said reducing agent is an aldehyde.

19. The method according to claim 18, wherein said aldehyde is transparent to the radiation and is present as a fluid environment with respect to said film when the beam is applied to said film.

20. The method according to claim 19, wherein said aldehyde is present as a gaseous atmosphere.

21. The method according to claim 19, wherein said aldehyde is present as a liquid solution in which the substrate is immersed for a sufficient time to swell the film.

22. The method according to claim 17, wherein said reducing agent is a polymeric coating overlying said film.

23. The method according to claim 22, wherein said polymeric coating is a polymer of an aldehyde monomer compound.

24. The method according to claim 22, wherein said polymeric film is polyacrolein.

25. The method according to claim 23, wherein said polymeric film includes an additive which enhances absorption of infrared radiation.

26. The method according to claim 13, wherein said infrared radiation beam is a laser beam constituted of high-peak power pulses of short duration.

27. The method according to claim 26, wherein said laser beam includes a laser pulse for each pixel of the image to be printed.

28. The method according to claim 26, wherein said laser beam is an Nd:YAG laser beam of 1.06 $\mu$m, which is absorbed selectively by the copper oxide film, whereas the copper layer reflects most of the energy, resulting in a high degree of selective heating only in the copper oxide layer.

* * * * *